United States Patent [19]
Strauss

[11] Patent Number: 5,418,476
[45] Date of Patent: May 23, 1995

[54] LOW VOLTAGE OUTPUT BUFFER WITH IMPROVED SPEED

[75] Inventor: Mark S. Strauss, Allentown, Pa.

[73] Assignee: AT&T Corp., Murray Hill, N.J.

[21] Appl. No.: 281,899

[22] Filed: Jul. 28, 1994

[51] Int. Cl.$^6$ ............... H03K 17/16; H03K 19/003
[52] U.S. Cl. ............................. 326/58; 326/81; 327/374; 327/437
[58] Field of Search .......... 326/58, 81; 327/108, 327/374, 376, 377, 427, 434, 436, 437; 361/91

[56] References Cited

U.S. PATENT DOCUMENTS

| | | | |
|---|---|---|---|
| 4,704,547 | 11/1987 | Kirsch | 307/443 |
| 4,740,713 | 4/1988 | Sakurai et al. | 307/200 B |
| 5,057,715 | 10/1991 | Larsen et al. | 307/451 |
| 5,239,211 | 8/1993 | Jinbo | 307/443 |
| 5,289,025 | 2/1994 | Lee | 257/299 |
| 5,343,099 | 8/1994 | Shichinohe | 307/571 |

OTHER PUBLICATIONS

IEEE 1992 Custom Integrated Circuits Conference. "3.3V-5V Compatible I/O Circuit Without Thick Gate Oxide". Makoto Takahashi et al. 23.3.1-23.3.4.
Patent application Ser. No. 08/144,594, filed Oct. 28, 1993, titled "Multi-Voltage Compatible Bidirectional Buffer" by Bernard Lee Morris.

*Primary Examiner*—David R. Hudspeth
*Assistant Examiner*—Stephen Calogero
*Attorney, Agent, or Firm*—James H. Fox

[57] ABSTRACT

An integrated circuit output buffer that operates at a low power supply voltage (e.g., 3.3 volts) shares an I/O bondpad with input circuitry that operates at a higher voltage (e.g., 5 volt) signal level. The higher voltage signal level is typically obtained by connection of the bondpad to a bus that is connected to one or more output buffers on other IC's that operate at the higher power supply voltage level. The inventive output buffer obtains a decreased propagation delay by the use of an additional pull-up transistor in a configuration that protects the low voltage output transistors, including the additional transistor, from the higher voltage signal levels present on the bondpad. In this manner, the output buffer may be used in applications that require the relatively low propagation delay specified for the PCI bus, for example.

8 Claims, 2 Drawing Sheets

LOW VOLTAGE OUTPUT BUFFER WITH IMPROVED SPEED

BACKGROUND OF THE INVENTION

1. Field of the Invention

The present invention relates to an integrated circuit (IC) having an output buffer.

2. Description of the Prior Art

Integrated circuits that operate at a relatively low power supply voltage (e.g., 3.3 volts) often need to interface with IC's or other components that operate at a higher signal voltage level (e.g., 5 volts). In that case, special attention needs to be paid to the input and output buffers of the low voltage IC. A first concern relates to the fact that the input buffers of the low voltage IC must accept the higher voltage swing (e.g., 0 to 5 volts) and operate properly, while avoiding damage to the transistors of the input buffers. In particular, the gate dielectric (typically an oxide) of a MOS transistor is especially susceptible to damage. This is because the low voltage operation usually requires a very thin gate dielectric (typically less than 100 Angstroms) to maintain high performance, and the 5 volt input signal applied across the dielectric from the gate to the drain, source and/or substrate of the input transistor tends to break down such a thin dielectric. In many cases, an input buffer and an output buffer share a single bondpad, referred to as an input/output (I/O) bondpad. The output buffer may need to supply only the lower voltage (e.g., 3.3 volt) output signal. However, the gate dielectric of the output transistor is also susceptible to breakdown from the higher voltage (e.g., 5 volt) input signal, that may also appear across the gate dielectric of the output transistor.

Various measures have been taken in the prior art to protect the transistors connected to the bondpads from high signal levels. In general, it is known to provide voltage-dropping transistors in series with the transistor being protected. For example, referring to FIG. 1, an input buffer 115 includes an inverter stage comprising complementary CMOS transistor 113 and 114 having their gates connected to the bondpad 100 through the pass transistor 112. The pass transistor 112 provides a voltage drop that reduces the maximum voltage applied to the gate of the protected transistors 113 and 114, while still allowing for transfer of the signal to and from the bondpad. Since the gate of transistor 112 is connected to $V_{DD}$ in the embodiment shown, the maximum voltage on node 116 is limited to an n-channel transistor threshold $(V_{tn})$ below $V_{DD}$. Hence, if $V_{tn}=1$ volt and $V_{DD}=3.3$ volts, then the voltage on inverter input node 116 is limited to $3.3-1=2.3$ volts with respect to the negative (ground) power supply voltage $V_{SS}$.

Furthermore, the exemplary tri-state output buffer connected to the bondpad 100 includes various protective transistors to protect the p-channel pull-up transistor 102 and n-channel pull-down transistor 104. A first protective p-channel transistor 108 has its gate biased at $V_{DD}-V_{tp}$ (where $V_{tp}$ is the threshold of a p-channel transistor) by transistors 107, 109 and 110. Note that transistor 107 has its backgate connected to $V_{DD}(=3.3$ volts), while transistor 108 has its backgate set at $V_{D5}$ $(=5$ volts). This backgate biasing scheme sets the circuit such that the threshold of transistor 108 will always be greater than that of transistor 107, so that when 0 to 3 volt swings are applied to the bondpad, transistor 108 is off. However, when a high voltage (e.g., 5 volt) input signal is present on bondpad 100, transistor 108 conducts, thereby clamping the gate-to-source voltage of transistor 101 at approximately zero volts, protecting the gate to source dielectric and turning off transistor 101. The drain voltage of transistor 101 is charged to $V_{DD}$ through transistor 102. Therefore, the voltage across the gate to drain dielectric of transistor 101 is limited to the input voltage on the bondpad $100-V_{DD}$. The voltage across the gate to substrate dielectric is limited to the input voltage $-V_{D5}$, thereby protecting the dielectric, when the high input voltage is applied to the bondpad.

A second protective transistor 105 is a voltage-dropping pass transistor that protects the pre-driver NAND gate 106 from high signal voltages on the bondpad 100 in the same manner as transistor 112 protects the input stage. The transistor 105 allows sufficient signal drive voltage (0 to $V_{DD}-V_{tn}$) from NAND gate 106 to be applied to the gate of pull-up transistor 101. Transistor 102 is driven by pre-driver NAND gate 106 with voltage swings from 0 to $V_{DD}$. Turning off transistor 102 $(V_{source}=V_{gate}=V_{DD})$ ensures that there is no direct current (DC) path between $V_{DD}$ and $V_{SS}$ through transistors 101, 102, 103, 104, and therefore bondpad 100 can be pulled down to a full zero level $(V_{SS})$, when transistor 104 is turned on. The protective transistor 103 serves to limit the voltage on the drain of transistor 104 to $V_{DD}-V_{tn}$, thereby protecting it also. The gate to drain voltage of transistor 103 is limited to $V_{DD}$ minus the input signal voltage.

In order to obtain the desired backgate bias voltage on a given transistor, the transistor may be formed in a doped semiconductor tub region that is connected to the desired power supply voltage conductor (e.g., $V_{DD}$ or alternatively $V_{D5}$), according to techniques known in the art. In most cases, an integrated circuit that implements the inventive output buffer includes power supply terminals for both the buffer power supply voltage $(V_{DD})$ and also the power supply voltage that produces the high signal level $(V_{D5})$. This is convenient in most cases of mixed-voltage IC's in a given system, since both power supply levels must be supplied in that case anyway. However, in some cases, particularly with portable systems, it may be desirable to generate one of the power supply voltage levels from the other. For example, the low $(V_{DD})$ level may be generated by a voltage regulator from the high $(V_{D5})$ level. Alternatively, the high level may be generated from the low level by means of a voltage boost circuit, as shown for example in U.S. Pat. No. 5,289,025 coassigned herewith.

A second concern of output buffer design relates to the speed at which they operate, or the propagation delay through the output buffer. In particular, the specification for the peripheral component interface (PCI) bus requires that the propagation delays be minimal, since the allowed delay through the total logic path is 11 nanoseconds. It has been found that an output buffer in accordance with FIG. 1 may not meet this speed requirement, primarily because the pass transistor 105 limits the speed at which the drive signal is applied to the gate of transistor 101. This causes the bondpad 100 to be pulled up to $V_{DD}$ at a slower speed than if protective transistors were not present.

SUMMARY OF THE INVENTION

I have invented an integrated circuit having an output buffer that is protected against high signal voltage levels while still maintaining a high speed of operation. In order to obtain a decreased pull-up propagation delay, an additional p-channel pull-up transistor is included that has its drain connected to the output conductor through a voltage-dropping protective device. The voltage-dropping protective device is typically an n-channel transistor having its gate connected to the buffer power supply voltage ($V_{DD}$).

DETAILED DESCRIPTION

Figure 1:
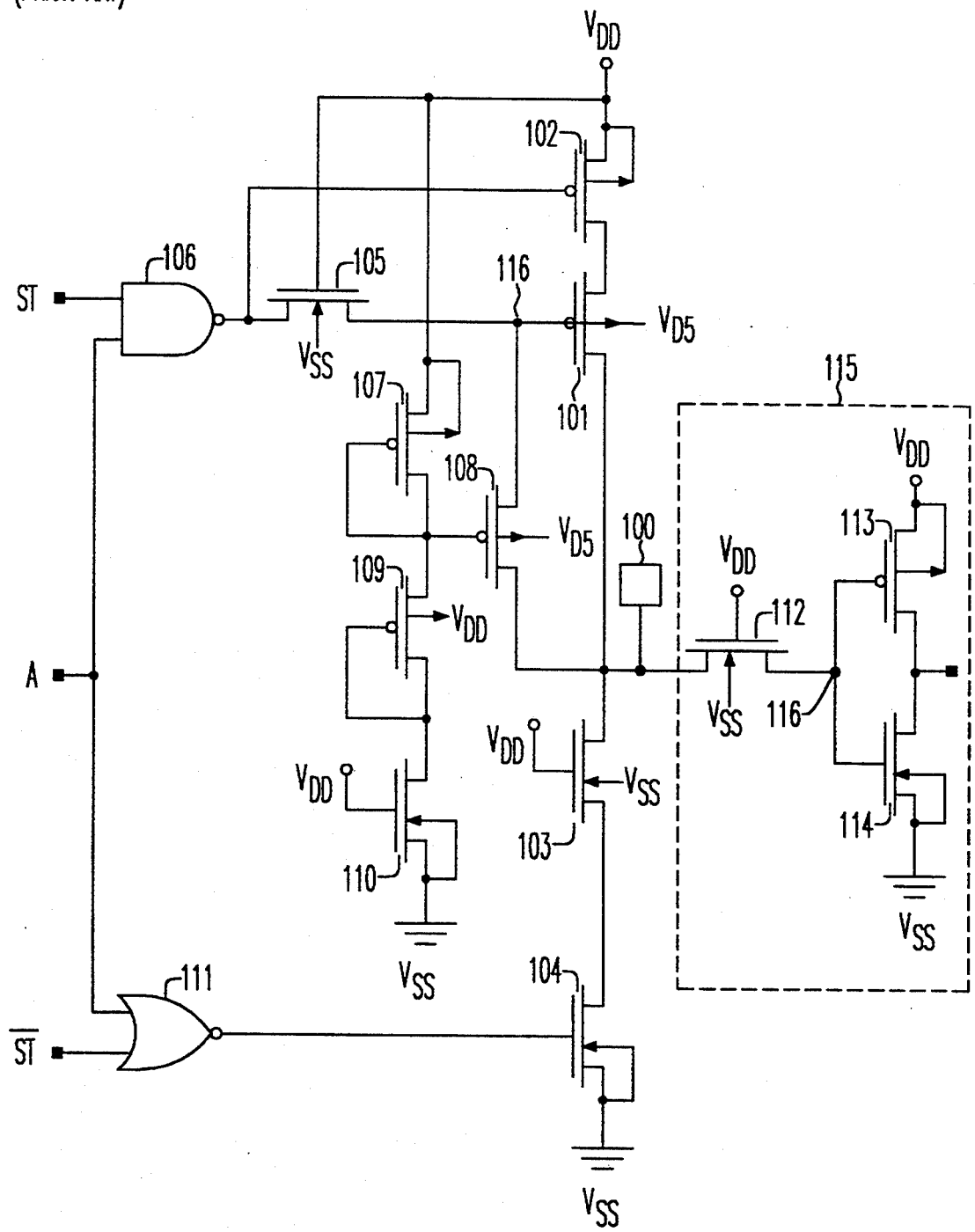
FIG. 1 shows a prior-art output buffer protected against high signal voltage levels on the output conductor.
Figure 2:
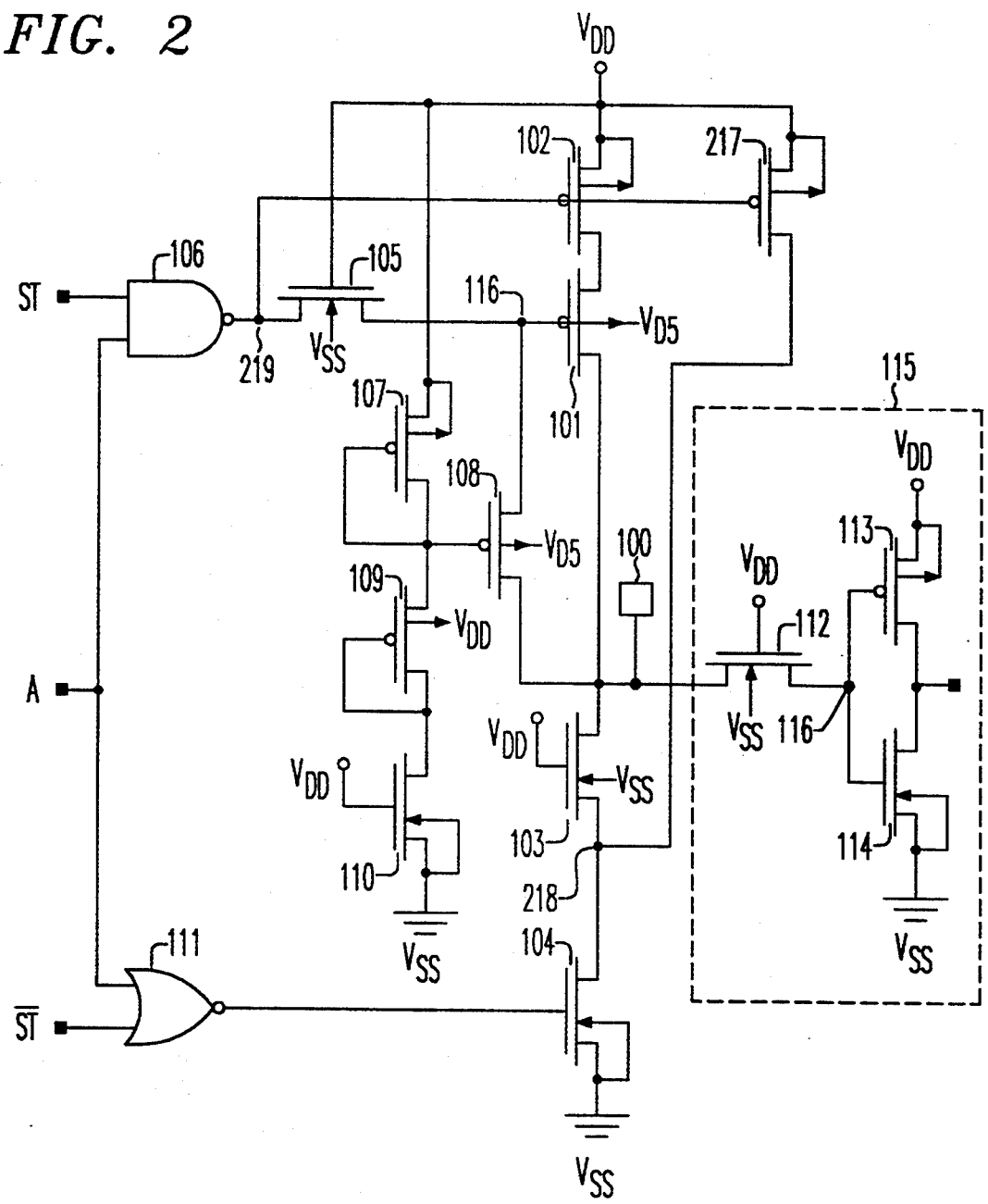
FIG. 2 shows an illustrative embodiment of an output buffer according to the inventive technique.

The following detailed description relates to an improved output buffer that obtains a decreased propagation delay while still tolerating higher voltage signal levels on an output conductor than the power supply voltage for the output buffer. Referring to FIG. 2, an embodiment of the improved output buffer is illustrated, using the same numerical designations for those components that are comparable to the prior-art output buffer of FIG. 1.

In the improved output buffer, an additional pull-up transistor 217 is included. Note however that the drain of additional transistor 217 is not connected to the I/O bondpad 100, as is conventional in the prior art. Rather, the drain of transistor 217 is connected to the junction (node 218) between the source of transistor 103 and the drain of transistor 104. In this manner, the maximum voltage on the drain of transistor 217 is limited to $V_{DD}-V_{tn}$, where $V_{tn}$ is the threshold voltage of an n-channel transistor (i.e., 103). In a typical case, $V_{tn}=1$ volts, and $V_{DD}=3$ volts in the illustrative case. Therefore, the maximum drain voltage on transistor 217, which occurs when a high voltage (e.g., 5 volts) signal is present on bondpad 100, is $3-1=2$ volts in the illustrative case.

The additional output transistor 217 decreases the pull-up propagation delay in the following manner, wherein it is assumed that the tri-state control signal ST is high (and $\overline{ST}$ is low), thereby enabling the output buffer:

(1) When the buffer input signal A is low, the voltage on the output of the pre-driver NAND gate 106 (node 219) is high. Therefore, the high voltage on the gate of additional transistor 217 causes that transistor to be non-conducting. Similarly, the pull-up transistor 102 is also non-conducting. Therefore, there is no pull-up voltage applied through protective transistor 101 nor transistor 103 to the bondpad 100. However, the low input signal A causes the pre-driver NOR gate 111 to have a high output voltage level. Therefore, the pull-down transistor 104 conducts, thereby pulling down the voltage of the bondpad 100, through the protective transistor 103, to approximately $V_{SS}$ (zero volts).

(2) When the buffer input signal A goes high, the output of the pre-driver NAND gate (node 219) goes low, and the output of the pre-driver NOR gate goes low. The p-channel pull-up transistor 102 conducts but cannot pull the bondpad to $V_{DD}$, because node 116 is delayed in going low by transistor 105. When node 116 goes low, the bondpad can be pulled to $V_{DD}$.

(3) In addition to the operation as described in (1) and (2) above, the additional pull-up transistor 217 also conducts when node 219 is low, thereby pulling up node 218 to $V_{DD}$, and thus pulling up the bondpad to $V_{DD}=V_{tn}$ through transistor 103. The voltage on bondpad 100 is pulled up sooner than in the prior art technique. Note that the additional current flow from the bondpad 100 is conducted through protective transistor 103, which is biased to conduct by the positive voltage ($V_{DD}$) on its gate. It is apparent that protective transistor 103 thus serves to protect both the pull-down transistor 104 and also the additional pull-up transistor 217 in the inventive technique.

Figure 3:
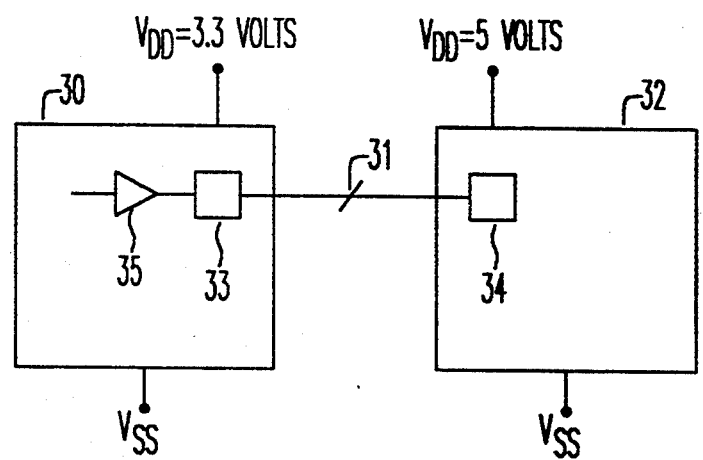
FIG. 3 shows a system that may implement the inventive technique.

Shown in FIG. 3 is an integrated circuit (30) that includes one or more of the inventive output buffers (35) connected to a bondpad (33) connected to a bus conductor (31). The bus conductor is connected to a bondpad (34) on another IC (32) that operates at a higher voltage level. Note that while bondpads are illustratively used as output conductors for a given IC, other types of output conductors are possible, including solder bumps, etc.

Note also that while the illustrative embodiment utilizes a tri-state output buffer, the present invention may be practiced with non tri-state output buffers. Furthermore, while one use of various protective transistors has been shown in the illustrative embodiment, the inventive technique may be practiced with output buffers having transistors protected by various other techniques. For example, it is known to use integrated circuit fabrication techniques to provide for protective transistors having different threshold voltages, rather than using different backgate bias voltages. While the illustrative power supply $V_{DD}$ voltage level has been shown as 3.3 volts, and the high voltage signal level as 5 volts, other values are possible. For example, future generation IC's may use 2 volt power supply levels on the inventive output buffer, and either 3.3 volt or 5 volt high signal levels applied to the bondpad. Finally, while the illustrative embodiment shows an input buffer (115) located on the same IC, and sharing the same bondpad (100), as the inventive output buffer, that is not the only configuration possible. For example, the inventive technique may be used in applications where there is no input buffer on the same IC that is coupled to the same bondpad as the output buffer, but where the output buffer must still be protected against high voltages, as may be present on the conductors of bus 31 shown in FIG. 3. Still other applications are possible.

I claim:

1. An integrated circuit comprising an output buffer coupled to an output conductor, wherein said output buffer includes a first p-channel pull-up transistor having a gate coupled to receive a buffer input signal, and source and drain regions connected between a positive power supply voltage conductor and said output conductor, and an n-channel pull-down transistor having a gate coupled to receive the buffer input signal, a source coupled to a negative power supply voltage conductor and a drain connected at a given node to a voltage-dropping protective device coupled to said output conductor, characterized in that said integrated circuit further comprises an additional p-channel pull-up transistor having a source coupled to said positive power supply voltage conductor, a drain coupled to said given node, and a gate coupled to receive said buffer input signal.

2. The integrated circuit of claim 1 wherein said voltage-dropping protective device is an n-channel voltage-dropping transistor.

3. The integrated circuit of claim 2 wherein the gate of said n-channel voltage dropping transistor is connected to said positive power supply voltage conductor.

4. The integrated circuit of claim 1 wherein said buffer input signal is supplied to said p-channel pull-up transistor and said additional p-channel pull-up transistor from the output of a NAND gate circuit that receives a buffer input signal on a first input and a tri-state control signal on a second input.

5. A system including a first integrated circuit having an output buffer operating at a low power supply voltage and connected to a signal bus, and also including a second integrated circuit having an output buffer operating at a higher power supply voltage and also connected to said signal bus; wherein said output buffer of said first integrated circuit includes a first p-channel pull-up transistor having a gate coupled to receive a buffer input signal, and source and drain regions connected between a positive power supply voltage conductor and an output conductor, and an n-channel pull-down transistor having a gate coupled to receive the buffer input signal, a source coupled to a negative power supply voltage conductor and a drain connected at a given node to a voltage-dropping protective device coupled to said output conductor, characterized in that said first integrated circuit further comprises an additional p-channel pull-up transistor having a source coupled to said positive power supply voltage conductor, a drain coupled to said given node, and a gate coupled to receive said buffer input signal.

6. The system of claim 5 wherein said voltage-dropping protective device is an n-channel voltage-dropping transistor.

7. The system of claim 6 wherein the gate of said n-channel voltage dropping transistor is connected to said positive power supply voltage conductor.

8. The system of claim 5 wherein said buffer input signal is supplied to said p-channel pull-up transistor and said additional p-channel pull-up transistor from the output of a NAND gate circuit that receives a buffer input signal on a first input and a tri-state control signal on a second input.

* * * * *